United States Patent Office 3,623,870

Patented Nov. 30, 1971

3,623,870

TECHNIQUE FOR THE PREPARATION OF THERMALLY STABLE PHOTORESIST

Robert K. Curran, Stirling, Michael R. Goldrick, East Orange, and Robert E. Kerwin, Westfield, N.J., assignors to Bell Telephone Laboratories, Incorporated, Murray Hill, N.J.

No Drawing. Filed July 22, 1969, Ser. No. 843,779
Int. Cl. G03c *1/58*
U.S. Cl. 96—49 8 Claims

ABSTRACT OF THE DISCLOSURE

A thermally stable photoresist is obtained by reacting a polyamic acid with a dichromate photosensitizer, exposing the resultant product to a light source, developing with a 1-methyl-2-pyrrolidinone-solvent mixture and baking the resultant composition. The resultant photoresist may be used to produce photolithographic images with resolutions of $2\mu$ that are thermally stable at temperatures in excess of 500° C.

This invention relates to a technique for the preparation of a photoresist. More particularly, the present invention relates to a technique for the preparation of a thermally stable photoresist.

The increasing sophistication of semiconductor technology has led to the development of various processing techniques, such as, ion beam implantation, sputter etching, etc., which require photoresists manifesting thermal stability at temperatures in excess of 400° C. Unfortunately, all commercially available photoresists begin to degrade at temperatures of the order of 200° C., so creating a need which heretofore has not been successfully satisfied.

In accordance with the present invention, the prior art difficulty has been obviated by the development of a novel photoresist system including polyimide films which are stable in air at temperatures ranging up to 400° C. and higher. Briefly, the inventive composition is obtained by forming a mixture of a polyamic acid and a soluble dichromate salt, applying the mixture to a suitable substrate and exposing, developing and baking the resultant coating. Studies have revealed that the resultant photoresist formulation may be used to produce photolithographic images with resolutions of two microns that are thermally stable and readily reproduced.

As indicated, the first stage in the practice of the invention involves forming a mixture of a polyamic acid and a soluble dichromate salt which serves as a photosensitive cross-linking agent. The polyamic acid selected comprises the product of the first stage condensation reaction of pyromellitic dianhydride and 4,4′ diamino diphenyl ether dissolved in a suitable solvent such as 1-methyl-2-pyrrolidinone, dimethylformamide, dimethylacetamide, etc. The composition obtained typically contains from 10 to 15%, by weight, polymer.

The dichromate salt employed may be selected from among any of the known soluble dichromates, such as the dichromate of sodium, potassium or ammonium. Studies have revealed that in order to attain the required characteristics in the final product, the ratio of polymer to dichromate in the mixture must range from 40:1 to 70:1.

A photoresist solution is then prepared by mixing the polyamic acid with the dichromate (as dissolved in solvent) so as to result in a solution containing from 7 to 10%, by weight, polymer, the minima and maxima being dictated by considerations relating to the viscosity of the solution.

The initial photoresist solution having been prepared, the next step in the practice of the present invention involves applying the mixture to a suitable substrate member. This end is conveniently attained by conventional spin coating techniques employing spin rates within the range of 2,000 to 10,000 r.p.m. The substrate chosen may typically comprise glass, a semiconductor wafer or any finished integrated circuit. The only limitations imposed on the substrate relate to its thermal stability at the temperatures to which it will be subjected during the course of the processing. Accordingly, a wide range of materials has been found suitable. The thickness of the film applied to the substrate member desirably ranges from 0.1 to 2 microns, such limits being dictated by practical considerations. Coatings of the desired thickness are generally applied over time periods ranging from 1 to 60 seconds. During the course of the very brief spin application, the films applied to the surface of the substrate generally dry due to solvent evaporation. However, in the event that films of the order of two microns in thickness are desired, it has been found helpful to employ a post-application baking step by heating the coating at temperatures within the range of 40 to 70° C. for time periods within the range of 1 to 5 minutes. Drying may be observed visually by variations in the interference patterns of the coated films.

Thereafter, the coating is exposed to a light source having a wavelength within the range of 3500 to 5300 angstroms through a suitable mask for the purpose of attaining an insoluble partially cross-linked polyamic acid. The noted range of wavelengths is dictated by the absorption range of the dichromate photosensitizer employed. A peak sensitivity has been found to correspond with a wavelength of 3800 angstroms. The next stage in the preparation of the novel resist involves developing the exposed coating. Developing is effected with a solution comprising a mixture of 1,2-dichloroethane and 1-methyl-2-pyrrolidinone in a ratio ranging from 1:3 to 3:1. Variations from the noted range of ratios have been found to result either in inadequate development (>3:1 DCE/MP) or overdevelopment (<1:3 DCE/MP). Development is initiated by immersing the exposed coating in the developer solution for a time period ranging from 1 to 5 seconds and subsequently immersing the film for a time period within the range of 1 to 5 seconds in a solution of pure 1,2-dichloroethane.

After developing, the films are dried in air. The final stage in the preparation of the novel resist involves baking the developed film at temperatures within the range of 200 to 400° C. for a time period within the range of 1 to 30 minutes, the shorter time period corresponding with the higher temperature and the longer time period corresponding with the lower temperature. During this stage of the processing, the second stage condensation reaction occurs, thereby resulting in the formation of a thermally stable polyimide.

An example of the present invention is described in detail below. This example is included merely to aid in the understanding of the invention and variations may be made by one skilled in the art without departing from the spirit and scope of the invention.

EXAMPLE

A photoresist solution was prepared by mixing 4 milliliters of a polyamic acid (13%, by weight, polymer, remainder solvent) formed by the reaction of pyromellitic dianhydride and 4,4′ diamino diphenyl ether in 1-methyl-2-pyrrolidinone with 10 milligrams of sodium dichromate dissolved in 2 milliliters of 1-methyl-2-pyrrolidinone. The solution was next applied to an oxidized silicon wafer by spin coating at 7000 r.p.m. for a minute, so resulting in the formation of a coating one-half micron in thickness. Thereafter, the coated film was exposed through a mask to a filtered 200 watt mercury lamp for 120 seconds, for a total exposure energy of 1 joule. The exposed film was then developed for 5 seconds in a 1:1 mixture of dichloroethane and 1-methyl-2-pyrrolidinone and subsequently immersed for 5 seconds in 1,2-dichloroethane. Finally, the developed film was baked at 250° C. for 20 minutes so resulting in a thermally stable polyimide film.

Upon thermal gravimetric analysis, the film so obtained was found to be stable up to temperatures of the order of 500° C. The resultant polyimide resist image was also found to manifest resolution patterns of the order of 2.0 micron lines and spaces.

We claim:

1. The method of forming a thermally stable photoresist pattern on a substrate in which patterned areas of a soluble film, composed of a dichromate and an organic material capable of being rendered insoluble by the action of the dichromate in the presence of light, are insolubilized by exposing said areas to light, and the remaining soluble areas of said film are dissolved away, characterized in that said organic material is the polyamic acid reaction product of 4,4′ diamino diphenyl ether and pyromellitic dianhydride and in that the residual insolubilized areas of said film are baked at between 200° C. and 400° C., the ratio of polyamic acid to dichromate being within the range of 40:1 to 70:1.

2. Technique in accordance with claim 1 wherein said mixture is applied in thicknesses ranging from one-half to two microns by spin coating techniques.

3. Technique in accordance with claim 1 wherein said light manifests a wavelength within the range of 3500 to 5300 angstroms.

4. Technique in accordance with claim 1 wherein said film is baked for a time period within the range of 1–30 minutes.

5. Technique in accordance with claim 3 wherein said light manifests a wavelength of 3800 angstroms.

6. Technique in accordance with claim 5 wherein said baking is effected at 250° C. for 20 minutes.

7. Technique in accordance with claim 6 wherein said substrate member comprises an oxidized silicon wafer.

8. Thermally stable photoresist comprising a mixture of a soluble dichromate and a polyamic acid comprising the first stage condensation product of 4,4′ diamino diphenyl ether and pyromellitic dianhydride, the ratio of polyamic acid to dichromate ranging from 40:1 to 70:1.

References Cited

UNITED STATES PATENTS

| | | | |
|---|---|---|---|
| 2,500,028 | 3/1950 | Griggs et al. | 96—36 |
| 3,395,014 | 7/1968 | Cohen et al. | 96—36 |
| 3,462,268 | 8/1969 | Danhauser et al. | 96—35.1 |

NORMAN G. TORCHIN, Primary Examiner
J. L. GOODROW, Assistant Examiner

U.S. Cl. X.R.

96—35.1